United States Patent
Rajapaksha et al.

(10) Patent No.: US 11,380,631 B2
(45) Date of Patent: Jul. 5, 2022

(54) LEAD FRAME FOR MULTI-CHIP MODULES WITH INTEGRATED SURGE PROTECTION

(71) Applicant: Texas Instruments Incorporated, Dallas, TX (US)

(72) Inventors: Dushmantha Bandara Rajapaksha, Allen, TX (US); Vijayalakshmi Devarajan, Plano, TX (US); Roland Sperlich, Rockwall, TX (US); Wesley Ray, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 161 days.

(21) Appl. No.: 16/697,617

(22) Filed: Nov. 27, 2019

(65) Prior Publication Data
US 2021/0159192 A1 May 27, 2021

(51) Int. Cl.
*H01L 23/62* (2006.01)
*H01L 23/31* (2006.01)
*H01L 23/495* (2006.01)

(52) U.S. Cl.
CPC .......... *H01L 23/62* (2013.01); *H01L 23/3114* (2013.01); *H01L 23/4951* (2013.01); *H01L 23/4952* (2013.01); *H01L 23/49503* (2013.01); *H01L 23/49562* (2013.01); *H01L 23/49575* (2013.01)

(58) Field of Classification Search
CPC .............. H01L 23/3114; H01L 23/495; H01L 23/49503; H01L 23/4951; H01L 23/4952; H01L 23/49541; H01L 23/49562; H01L 23/49575; H01L 23/62
See application file for complete search history.

(56) References Cited

U.S. PATENT DOCUMENTS 5,773,876 A * 6/1998 Mekdhanasarn ....... H01L 24/49
257/665
2003/0218241 A1* 11/2003 Kunimatsu ....... H01L 23/49575
257/687

(Continued)

OTHER PUBLICATIONS

RS-422 and RS-485 Standards Overview and System Configurations, https://www.ti.com/lit/an/slla070d/slla070d.pdf, retrieved Feb. 18, 2022 (Year: 2010).*

(Continued)

*Primary Examiner* — Andres Munoz
(74) *Attorney, Agent, or Firm* — John R. Pessetto; Charles A. Brill; Frank D. Cimino

(57) ABSTRACT

A lead frame for a multi-chip module includes a first conductor structure disposed on a substrate and having first and second arms linked at an angle. The first conductor structure is connected to ground. The lead frame also includes a second conductor structure disposed on the substrate and connected to a voltage supply. The second conductor structure is spaced apart and electrically isolated from the first conductor structure. The first and the second conductor structures are arranged to flank a plurality of integrated circuits (ICs) including one or more surge protection ICs disposed on the substrate. The first conductor structure is electrically connected to the plurality of ICs to provide electrical connections to ground, and the second conductor structure is electrically connected to the plurality of ICs to provide electrical connections to the voltage supply.

29 Claims, 3 Drawing Sheets

(56) References Cited

U.S. PATENT DOCUMENTS

| | | | |
|---|---|---|---|
| 2005/0024800 A1* | 2/2005 | Zecri | H01L 24/49 361/56 |
| 2005/0263863 A1* | 12/2005 | Sasaki | H01L 23/49541 257/676 |
| 2007/0145565 A1* | 6/2007 | Miyata | H01L 23/62 257/690 |
| 2008/0017998 A1* | 1/2008 | Pavio | H01L 23/552 257/787 |
| 2019/0229043 A1* | 7/2019 | Chen | H01L 23/49575 |

OTHER PUBLICATIONS

The RS-485 Design Guide, https://www.ti.com/lit/an/slla272d/slla272d.pdf?ts=1645156549066, retrieved Feb. 18, 2022 (Year: 2021).*

* cited by examiner

LEAD FRAME FOR MULTI-CHIP MODULES WITH INTEGRATED SURGE PROTECTION

BACKGROUND

The disclosure generally relates to the field of packaged semiconductor devices. More particularly, the disclosure relates to a lead frame for multi-chip modules with integrated surge protection.

Description of the Related Art

A multi-chip module is an electronic assembly where multiple integrated circuits (ICs or "chips") and semiconductor dies are integrated onto a unifying substrate. A lead frame is formed on the substrate to which ICs or chips are bonded. The lead frame is a thin layer of metal frame formed using a conductive material such as copper, aluminum, or any other suitable conductive material. The lead frame includes die attach pads to which the ICs are attached and includes leads which serve as means for external electrical connection. The ICs are connected to the leads by wires through wirebonding. The lead frame carries signals from the ICs to the outside and provides mechanical support to the semiconductor dies.

Many multi-chip modules such as, for example, RS-485 transceiver ICs are used in metering, IP surveillance, multi-point communication networks and other outdoor applications, which make them vulnerable to electromagnetic interference (EMI) due to lightning strikes. Also, RS-485 transceiver ICs are deployed in industrial settings where motors, relays, and other inductive devices regularly generate short-duration, high-voltage pulses. An RS-485 bus can pickup the high-voltage pulses and damage the RS-485 transceiver ICs connected to the bus.

In existing RS-485 ICs, EMI protection is provided by external devices such as metal-oxide varistors (MOVs), transient-voltage-suppression (TVS) diodes, and gas discharge tubes. The external protection devices often require more PC board space than the RS-485 transceiver itself and add extra cost.

SUMMARY

Various aspects of the present disclosure are directed to a lead frame for a multi-chip module. In one aspect, a lead frame for a multi-chip module includes a first conductor structure disposed on a substrate and having first and second arms linked at an angle. The first conductor structure is connected to ground. The lead frame also includes a second conductor structure disposed on the substrate and connected to a voltage supply. The second conductor structure is spaced apart and electrically isolated from the first conductor structure. The first and the second conductor structures are arranged to flank a plurality of integrated circuits (ICs) including one or more surge protection ICs disposed on the substrate. The first conductor structure is electrically connected to the plurality of ICs to provide electrical connections to ground, and the second conductor structure is electrically connected to the plurality of ICs to provide electrical connections to the voltage supply.

In an additional aspect of the disclosure, the ICs include two surge protection ICs and a third IC disposed between the two surge protection ICs. The surge protection ICs are configured to short and conduct current responsive to a breakdown voltage, thereby bypassing current through the third IC. As an example, the third IC can be an RS-485 transceiver IC.

In an additional aspect of the disclosure, the surge protection ICs are semiconductor diodes configured to short and conduct current responsive to a breakdown voltage, thereby bypassing current through a third IC. The surge protection ICs are integrated into the multi-chip module.

In an additional aspect of the disclosure, the lead frame includes a plurality of attach pads arranged on the lead frame for attaching to the ICs. The lead frame also includes a plurality of leads arranged on the lead frame and configured to provide external connections to the ICs. The ICs are connected to the leads by wires through wirebonding.

In an additional aspect of the disclosure, the leads are arranged in compliance with the RS-485 standard. The leads are arranged to allow placement of external pin connections in compliance with the RS-485 standard.

In an additional aspect of the disclosure, a lead frame for a multi-chip module with integrated surge protection circuits includes a first lead frame segment disposed on a substrate and having first and second arms linked at an angle, wherein the first lead frame segment is formed from a thin layer of conductor material and connected to ground. The lead frame also includes a second lead frame segment disposed on the substrate, wherein the second lead frame segment is formed from the thin layer of conductor material and connected to a voltage supply. The second lead frame segment is spaced apart and electrically isolated from the first lead frame segment. The first and the second lead frame segments are arranged to flank a plurality of integrated circuits (ICs) including one or more surge protection ICs disposed on the substrate. The surge protection ICs are configured to short and conduct current responsive to a breakdown voltage thereby bypassing current from a third IC.

In an additional aspect of the disclosure, an RS-485 system with integrated surge protection circuits includes a first lead frame segment disposed on a substrate and having first and second arms linked at an angle, wherein the first lead frame segment is formed from a thin layer of conductor material and connected to ground. The RS-485 system also includes a second lead frame segment disposed on the substrate, wherein the second lead frame segment is formed from the thin layer of conductor material and connected to a voltage supply. The second lead frame segment is spaced apart and electrically isolated from the first lead frame segment. The first and the second lead frame segments are arranged to flank a plurality of surge protection ICs disposed on the substrate and an RS-485 transceiver IC disposed between the surge protection ICs. The surge protection ICs are configured to short and conduct current responsive to a breakdown voltage thereby bypassing current from the RS-485 transceiver IC.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 1:
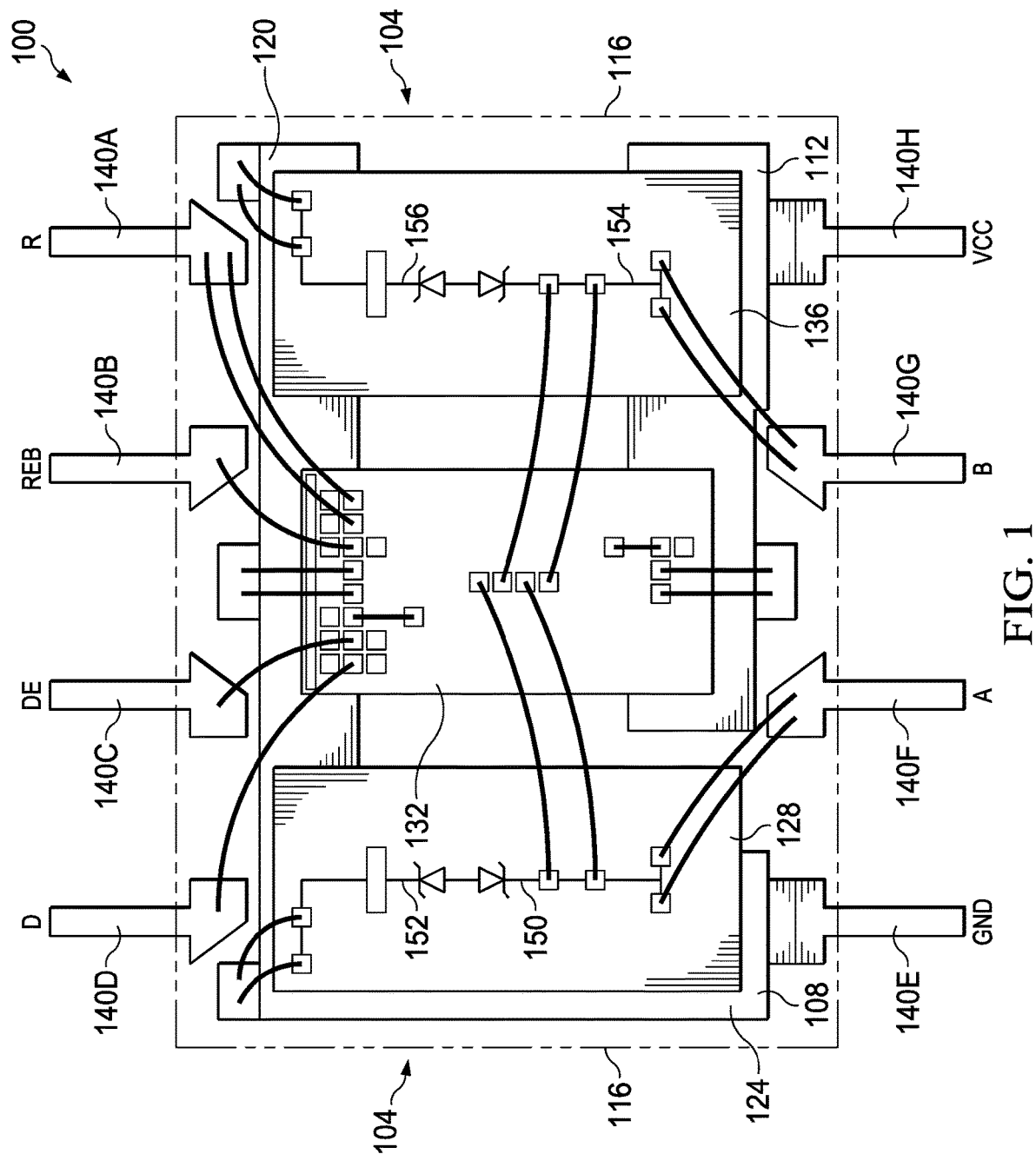
FIG. 1 is a top view of a multi-chip module in accordance with an exemplary embodiment.

Example embodiments include a lead frame structure for a multi-chip module. FIG. 1 is a top view of a multi-chip module 100 in accordance with an exemplary embodiment. The multi-chip module 100 can have rectangular, square or other suitable geometries. The multi-chip module 100 includes a segmented lead frame 104 having first and second conductor structures 108, 112 disposed on a substrate 116. The first conductor structure 108 has first and second arms 120, 124 linked at an angle (e.g., 90 degrees, less than 90 degrees, or greater than 90 degrees), thereby forming an angular geometry. In the example embodiment, the first and second arms 120, 124 are linked at 90 degrees, creating an L-shaped geometry of the first conductor structure 108. In other embodiments, the first conductor structure 108 can have other suitable shapes and geometry. However, The first conductor structure 108 is electrically connected to ground. The second conductor structure 112 is spaced apart and electrically isolated from the first conductor structure 108. The second conductor structure 112 is electrically connected to a voltage supply Vcc. The individual conductor structures can be singulated from a sheet or material or can be formed from a metal strip or from a thin layer of a conductive material.

With continuing reference to FIG. 1, the first and second conductor structures 108, 112 are spaced apart and they generally define an area on the substrate 116 that is partially enclosed due to gaps between the first and the second conductor structures 108, 112. The partially enclosed area has two adjacent sides defined by the angular geometry of the first conductor structure 108 and has a third side partially enclosed by the second conductor structure 112. A plurality of integrated circuits (ICs) or semiconductor dies 128, 132, 136 are disposed in the area partially enclosed by the first and second conductor structures 108, 112. The ICs 128, 132, 136 can be arranged adjacent to each other (e.g., in columns or in rows) on the substrate 116. The arrayed ICs 128, 132, 136 are flanked on two sides by the first and second arms 116, 120 of the first conductor structure 108. A third side of the arrayed ICs 128, 132, 136 is flanked by the second conductor structure 112. The first conductor structure 108 is electrically connected to the plurality of ICs 128, 132, 136 to provide electrical connections to ground, and the second conductor structure 112 is electrically connected to the plurality of ICs 128, 132, 136 to provide electrical connections to the voltage supply Vcc. The angular geometry allows the first conductor structure 108 to be connected to a ground terminal proximate to the edge of its second arm 124. Since the first conductor structure 108 via its second arm 124 extends to the side which is flanked by the second conductor structure 112, external connection pins for both ground and the voltage supply Vcc can be placed on the same side of the multi-chip module 100.

With continuing reference to FIG. 1, the lead frame 104 generally includes a plurality of leads 140A-140H that serve as means for external electrical connection. The lead frame 104 also includes die attach pads (not shown in FIG. 1) to which the ICs 128, 132, 136 are bonded or otherwise attached. The leads 140A-140H and the die attach pads can be arranged in proximity to each other. The ICs 128, 132, 136 are connected to the leads 140A-140H by wires through wirebonding.

In an exemplary embodiment, the IC 132 is an RS-485 transceiver IC while the ICs 128, 136 are surge protection ICs. The multi-chip module 100 provides surge protection with integrated or built-in surge protection ICs 128, 136, thus eliminating the need for external protection devices. The ICs are arranged in an order where the RS-485 transceiver IC 132 is placed between the two surge protection ICs 128, 136, thus providing surge protection from two sides of the RS-485 transceiver IC 132. Depending on the surge, the surge protection ICs 128, 136 are able to bypass high surge current (or fault current) from one or both sides of the RS-485 transceiver IC 132, thereby providing enhanced surge protection.

In an exemplary embodiment, the leads 140A, 140B, 140C and 140D are electrically connected to external connection pins reserved for various signals in compliance with the RS-485 standard (e.g., D, DE, REB and R). The leads 140E and 140H are electrically connected to external connection pins for ground and the voltage supply Vcc, respectively, and the leads 140F and 140G are electrically connected to external connection pins reserved for an RS-485 bus (e.g., A and B). The external connection pins reserved for D, DE, REB, R, A and B are isolated from the voltage supply Vcc and ground. The geometry of the first conductor structure 108, which is electrically connected to ground, isolates high surge currents from the signal pins. Also, the geometry of the second conductor structure 112, which is electrically connected to the voltage supply Vcc and isolated from the first conductor structure 108, preserves industry standard RS-485 footprint.

In an exemplary embodiment, the surge protection ICs 128, 136 are semiconductor diodes (e.g., Zener diodes) which provide surge protection to the IC 132. The ICs 128, 136 (i.e., semiconductor diodes) have respective anode and cathode terminals. The semiconductor diodes (i.e, ICs 128, 136) allow current to flow not only from the anode terminals to the cathode terminals, but also in the reverse direction, when the voltage across the terminals exceeds a breakdown voltage.

With continuing reference to FIG. 1, an anode terminal 150 of the IC 128 is connected to the lead 140F via wires and a cathode terminal 152 of the IC 128 is connected via wires to the first conductor structure 108 which is connected to ground. Similarly, an anode terminal 154 of the IC 136 is connected to the lead 140G and a cathode terminal 156 of the IC 136 is connected to the first conductor structure 108 which is connected to ground. The layout of the surge protection ICs 128, 136 and the angular geometry of the first conductor structure 108 allow isolation of the RS-485 transceiver IC 132 from high surge currents on the RS-485 bus. Under normal operating conditions, the surge protection ICs 128, 136 both remain in an open circuit state, thus not allowing current to flow through the surge protection ICs 128, 136. If a surge voltage exceeding a breakdown voltage of the semiconductor diodes is created on the lead 140F, the IC 128 will short and allow a high surge current to conduct and flow to ground, thus bypassing the RS-485 transceiver IC 132. Similarly, if a surge voltage exceeding a breakdown voltage of the semiconductor diode appears on the lead 140G, the IC 136 will short and allow a high surge current to conduct and flow to ground, thus bypassing the RS-485 transceiver IC 132. Thus, the multi-chip module 100 provides enhanced surge protection to the RS-485 transceiver IC 132.

Furthermore, the geometries of the first conductor structure 108 and the second conductor structure 112 allow placement of external connection pins in compliance with the RS-485 standard. More specifically, the layout allows placement of signal pins D, DE, REB, R on a same side of the rectangular shaped multi-chip module 100 and allows placement of RS-485 bus pins, ground pin and the voltage supply Vcc pin on the opposite side, thus complying with the RS-485 standard by preserving RS-485 pin footprints.

In one aspect of the present disclosure, the lead frame 104 has a segmented structure having two segments spaced apart and electrically isolated from each other: a first lead frame segment which is referred to as the first conductor structure 108; and a second lead frame segment which is referred to as the second conductor structure 112. The first lead frame segment includes the first and second arms 120, 124 linked at an angle. The first lead frame segment (first conductor structure 108) is connected to ground and the second lead frame segment (second conductor structure 112) is connected to the voltage supply Vcc. The segmented geometry of the lead frame 104 allows integration of two surge protection diodes in the multi-chip module 100, yet comply with RS-485 standard. Also, the segmented geometry of the lead frame 104 having two spaced apart and isolated structures allow isolation of the signal pins from high surge currents and allow placement of external connection pins in compliance with the RS-485 standard.

In another aspect of the disclosure, the multi-chip module 100 is an RS-485 system with integrated or built-in surge protection ICs. The RS-485 system includes one or more surge protection ICs configured to short and conduct current responsive to a breakdown voltage, thus bypassing high surge current from an RS-485 IC.

Variations to the multi-chip module 100 are possible within the scope of the disclosure. For example, the multi-chip module 100 can be configured with only one surge protection IC or more than two surge protection ICs. Also, the multi-chip module 100 can be configured with two or more main ICs where the mains ICs can, for example, be RS-485 transceiver ICs or any other ICs. Other variations within the scope of the disclosure are possible.

Figure 2:
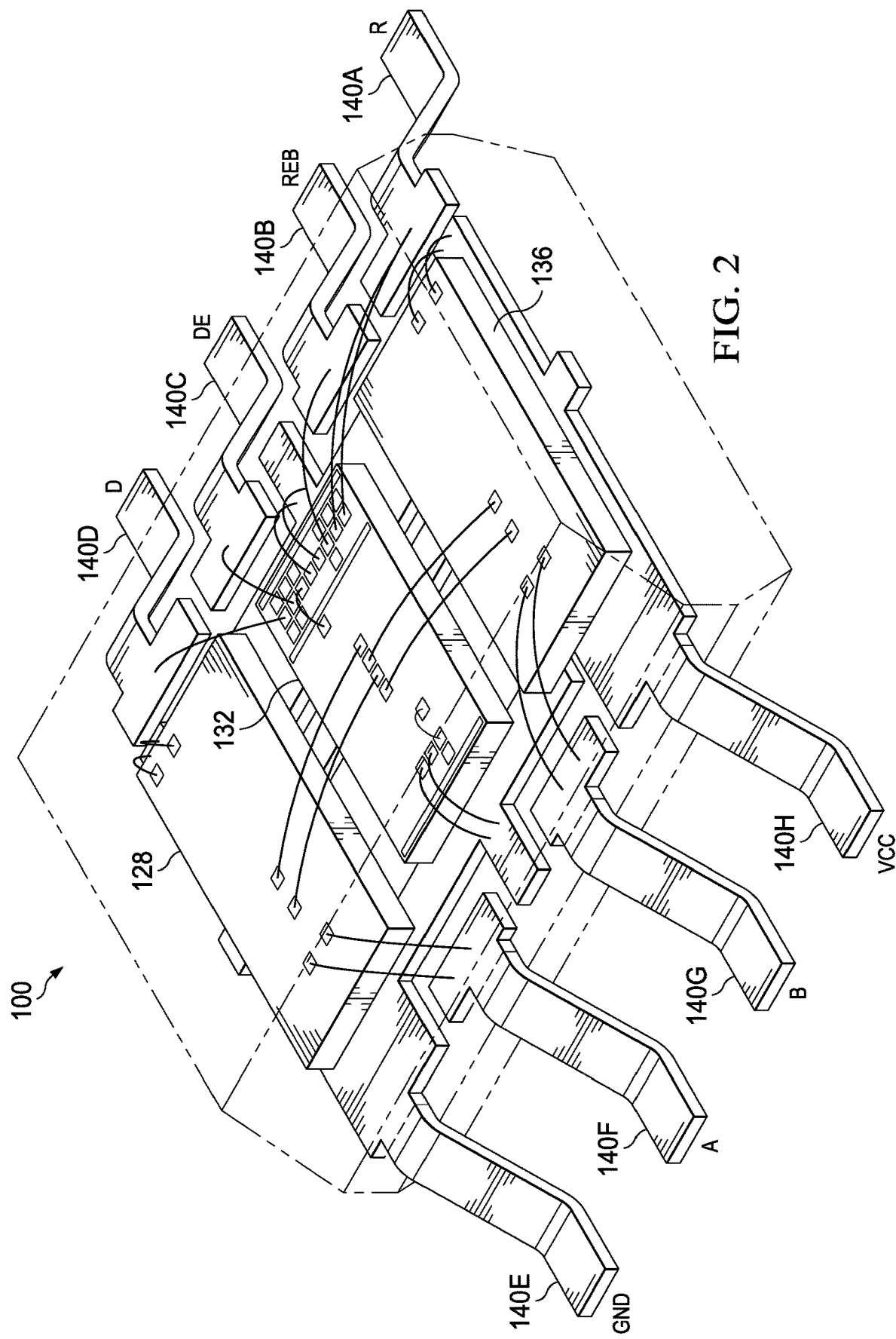
FIG. 2 is a top-perspective view of a multi-chip module in accordance with an exemplary embodiment.
Figure 3:
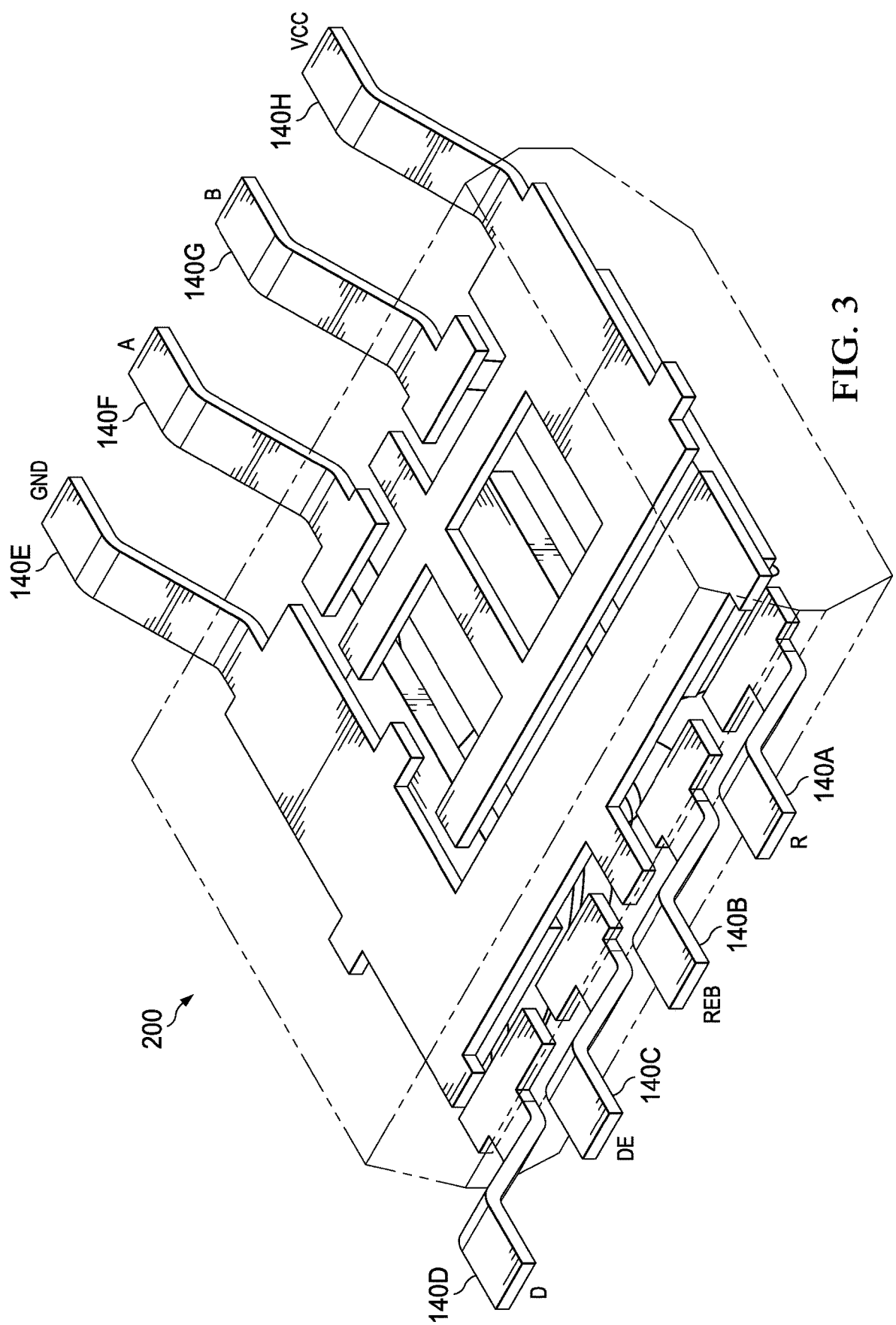
FIG. 3 is a bottom-perspective view of the multi-chip module in accordance with an exemplary embodiment.

FIG. 2 is a top-perspective view of the multi-chip module 100 in accordance with an exemplary embodiment. The top-perspective view shows the RS-485 IC 132 is placed between the two surge protection ICs 128, 136. Thus, surge protection is provided from both sides of the RS-485 IC 132. In compliance with the RS-485 standard, on one side the multi-chip module 100 provides external connection pins 140A, 140B, 140C, 140D reserved for respective signals R, REB, DE, D, and on the other side the multi-chip module 100 provides external connection pins 140F, 140G reserved for respective signals A, B(RS-485 bus signals) and also provides external connection pins 140H, 140E for respective ground and the voltage supply Vcc. FIG. 3 shows a bottom-perspective view of a multi-chip module 200. The bottom-perspective view also shows external pin connections R, REB, DE, D on one side of the module 200 and external pin connections Vcc, A, B and ground on the other side of the module 200 in compliance with the RS-485 standard.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A multi-chip module, comprising:
a first conductor structure having first and second arms linked at an angle, the first conductor structure connected to a ground terminal; and
a second conductor structure connected to a voltage supply terminal, the second conductor structure spaced apart and electrically isolated from the first conductor structure;
a plurality of integrated circuits (ICs) including one or more surge protection ICs disposed on an area partially enclosed by the first and second conductor structures, wherein the first conductor structure is electrically connected to the plurality of ICs to provide electrical connections to the ground terminal.

2. The multi-chip module of claim 1, wherein the plurality of ICs comprise an RS-485 transceiver IC wherein the second conductor structure is electrically connected to the RS-485 transceiver to provide electrical connections to the voltage supply terminal.

3. The multi-chip module of claim 1, wherein the plurality of ICs comprise two surge protection ICs and a third IC disposed between the two surge protection ICs, and wherein the two surge protection ICs are configured to short and conduct current responsive to a breakdown voltage, thereby bypassing current through the third IC.

4. The multi-chip module of claim 1, wherein the one or more surge protection ICs are semiconductor diodes configured to short and conduct current responsive to a breakdown voltage, thereby bypassing current through a third IC.

5. The multi-chip module of claim 1, wherein the first and second conductor structures form a lead frame of the multi-chip module.

6. The multi-chip module of claim 1, further comprising a plurality of attach pads arranged on the first and second conductor structures for attaching to the plurality of ICs.

7. The multi-chip module of claim 1, further comprising a plurality of leads arranged on the first and second conductor structures and configured to provide external connections to the plurality of ICs.

8. The multi-chip module of claim 7, wherein the plurality of ICs are connected to the plurality of leads by wires through wirebonding.

9. The multi-chip module of claim 7, wherein the plurality of leads are arranged in compliance with the RS-485 standard.

10. The multi-chip module of claim 7, wherein the plurality of leads are configured to allow placement of external pin connections in accordance with the RS-485 standard.

11. The multi-chip module of claim 1, wherein the first and second conductor structures are formed from a metal strip or a layer of a conductive material.

12. The multi-chip module of claim 1, further comprising a plurality of leads from a metal strip or a layer of a conductive material.

13. A multi-chip module with integrated surge protection circuits, comprising:
a first lead frame segment having first and second arms linked at an angle, wherein the first lead frame segment is formed from a layer of conductor material and connected to a ground terminal;
a second lead frame segment formed from the layer of conductor material and connected to a voltage supply terminal, the second lead frame segment spaced apart and electrically isolated from the first lead frame segment; and a plurality of integrated circuits (ICs) including one or more surge protection ICs disposed on an area partially enclosed by the first and second lead frame segments, wherein the one or more surge protection ICs are configured to short and conduct current responsive to a breakdown voltage thereby bypassing current from a third IC.

14. The multi-chip module of claim 13, wherein the first lead frame segment is electrically connected to the plurality of ICs to provide electrical connections to the ground terminal.

15. The multi-chip module of claim 13, wherein the third IC is an RS-485 transceiver IC.

16. The multi-chip module of claim 13, wherein the one or more surge protection ICs are semiconductor diodes configured to short and conduct current responsive to the breakdown voltage, thereby bypassing current from the third IC.

17. The multi-chip module of claim 13, wherein the one or more surge protection ICs are integrated into the multi-chip module.

18. The multi-chip module of claim 13, further comprising a plurality of attach pads arranged on the first and second lead frame segments for attaching to the plurality of ICs.

19. The multi-chip module of claim 13, further comprising a plurality of leads arranged on the first and second lead frame segments, and wherein the plurality of ICs are connected to the plurality of leads by wires through wirebonding.

20. The multi-chip module of claim 19, wherein the plurality of leads are arranged in compliance with the RS-485 standard.

21. The multi-chip module of claim 19, wherein the plurality of leads are configured to allow placement of external pin connections in compliance with the RS-485 standard.

22. An RS-485 system with integrated surge protection circuits, comprising:

a first lead frame segment having first and second arms linked at an angle, wherein the first lead frame segment is formed from a layer of conductor material and connected to a ground terminal;

a second lead frame segment formed from the layer of conductor material and connected to a voltage supply terminal, the second lead frame segment spaced apart and electrically isolated from the first lead frame segment;

a plurality of integrated circuits (ICs) including one or more surge protection ICs disposed on an area partially enclosed by the first and second lead frame segments, wherein the one or more surge protection ICs are configured to short and conduct current responsive to a breakdown voltage thereby bypassing current from an RS-485 transceiver IC.

23. The RS-485 system of claim 22, wherein the first lead frame segment is electrically connected to the RS-485 transceiver IC and the one or more surge protection ICs to provide electrical connections to the ground terminal, and wherein the second lead frame segment is electrically connected to the RS-485 transceiver IC to provide electrical connections to the voltage supply terminal.

24. The RS-485 system of claim 22, wherein the one or more surge protection ICs are semiconductor diodes configured to short and conduct current responsive to the breakdown voltage, thereby bypassing current from the RS-485 transceiver IC.

25. The RS-485 system of claim 22, wherein the one or more surge protection ICs are integrated into the RS-485 system.

26. The RS-485 system of claim 22, further comprising a plurality of attach pads arranged on the first and second lead frame segments for attaching to the RS-485 transceiver IC and the one or more surge protection ICs.

27. The RS-485 system of claim 22, further comprising a plurality of leads arranged on the first and second lead frame segments, and wherein the RS-485 transceiver IC and the one or more surge protection ICs are connected to the plurality of leads by wires through wirebonding.

28. The RS-485 system of claim 27, wherein the plurality of leads are arranged in accordance with the RS-485 standard.

29. The RS-485 system of claim 27, wherein the plurality of leads are configured to allow placement of external pin connections in accordance with the RS-485 standard.

* * * * *